US008506715B2

(12) United States Patent
Neal

(10) Patent No.: US 8,506,715 B2

(45) Date of Patent: Aug. 13, 2013

(54) COATING DEPOSITION APPARATUS AND METHOD THEREFOR

(75) Inventor: James W. Neal, Ellington, CT (US)

(73) Assignee: United Technologies Corporation, Hartford, CT (US)

( * ) Notice: Subject to any disclaimer, the term of this patent is extended or adjusted under 35 U.S.C. 154(b) by 11 days.

(21) Appl. No.: 12/977,298

(22) Filed: Dec. 23, 2010

(65) Prior Publication Data

US 2012/0164326 A1 Jun. 28, 2012

(51) Int. Cl.
*C23C 16/00* (2006.01)

(52) U.S. Cl.
USPC ............ 118/732; 118/726; 118/727; 118/728

(58) Field of Classification Search
USPC ................................. 118/732, 726, 727, 728
See application file for complete search history.

(56) References Cited

U.S. PATENT DOCUMENTS 3,889,019 A 6/1975 Blecherman et al.
5,997,947 A 12/1999 Burns et al.
7,718,222 B2 5/2010 Hass et al.
2004/0261914 A1* 12/2004 Boucard et al. ............... 148/518
2006/0169211 A1 8/2006 Kim et al.
2008/0075195 A1 3/2008 Pajukoski et al.
2008/0092820 A1 4/2008 Kim et al.
2008/0131611 A1 6/2008 Hass et al.
2008/0220177 A1 9/2008 Hass et al.
2009/0123646 A1* 5/2009 Varetti .......................... 427/237

FOREIGN PATENT DOCUMENTS

WO 9216672 10/1992
WO 2006041239 4/2006

OTHER PUBLICATIONS

Singapore Patent Application No. 201109548-6. Intellectual Property Office of Singapore Search Report. Aug. 21, 2012.

* cited by examiner

*Primary Examiner* — Keath Chen
(74) *Attorney, Agent, or Firm* — Carlson, Gaskey & Olds, P.C.

(57) ABSTRACT

A coating deposition apparatus includes a plurality of mounts that are adapted to mount work pieces at respective work piece locations. A crucible is located adjacent the plurality of mounts for emitting a source coating material. A plurality of gas nozzles are respectively directed at the work piece locations to scatter the emitted source coating material at surfaces of the work pieces that are otherwise difficult to coat.

14 Claims, 3 Drawing Sheets

COATING DEPOSITION APPARATUS AND METHOD THEREFOR

BACKGROUND

This disclosure relates to coating equipment and, more particularly, to a deposition apparatus that facilitates deposition of a coating material onto surfaces of a work piece that are difficult to coat.

Physical vapor deposition ("PVD") is one common method for coating a work piece, such as a gas turbine engine airfoil. For instance, the coating may be a protective coating or a bond coat for adhesion of an over-coating. One type of PVD process utilizes an electron beam to melt and vaporize a source coating material in a crucible. The vaporized source material deposits onto the substrate. Generally, electron beam PVD and variations of this process, such as electron beam directed vapor deposition ("EB-DVD"), coat surfaces that are in a line-of-sight from the crucible. Surfaces that are not in the line-of-sight of the crucible may not receive as much of the coating material.

SUMMARY

An example coating deposition apparatus includes a plurality of mounts that are adapted to mount work pieces at respective work piece locations. A crucible is located adjacent the plurality of mounts for emitting a source coating material. A plurality of gas nozzles are respectively directed at the work piece locations to scatter the emitted source coating material at surfaces of the work pieces that are otherwise difficult to coat.

In another aspect, a coating deposition apparatus includes a fixture having a plurality of mounts that are adapted to mount work pieces at respective work piece locations. A gas supply passage runs within the fixture. A crucible is located adjacent the plurality of mounts for presenting a source coating material. A plurality of gas nozzles is connected with the gas supply passage and respectively directed at the work piece locations.

An example method for use with a coating deposition apparatus includes mounting work pieces on a plurality of mounts at respective work piece locations, emitting a source coating material from a crucible that is adjacent to the plurality of mounts, and emitting gas streams from a plurality of gas nozzles that re respectively directed at the work piece locations to direct the emitted source coating material at the work pieces.

BRIEF DESCRIPTION OF THE DRAWINGS

The various features and advantages of the disclosed examples will become apparent to those skilled in the art from the following detailed description. The drawings that accompany the detailed description can be briefly described as follows.

DETAILED DESCRIPTION OF THE PREFERRED EMBODIMENT

Figure 1:
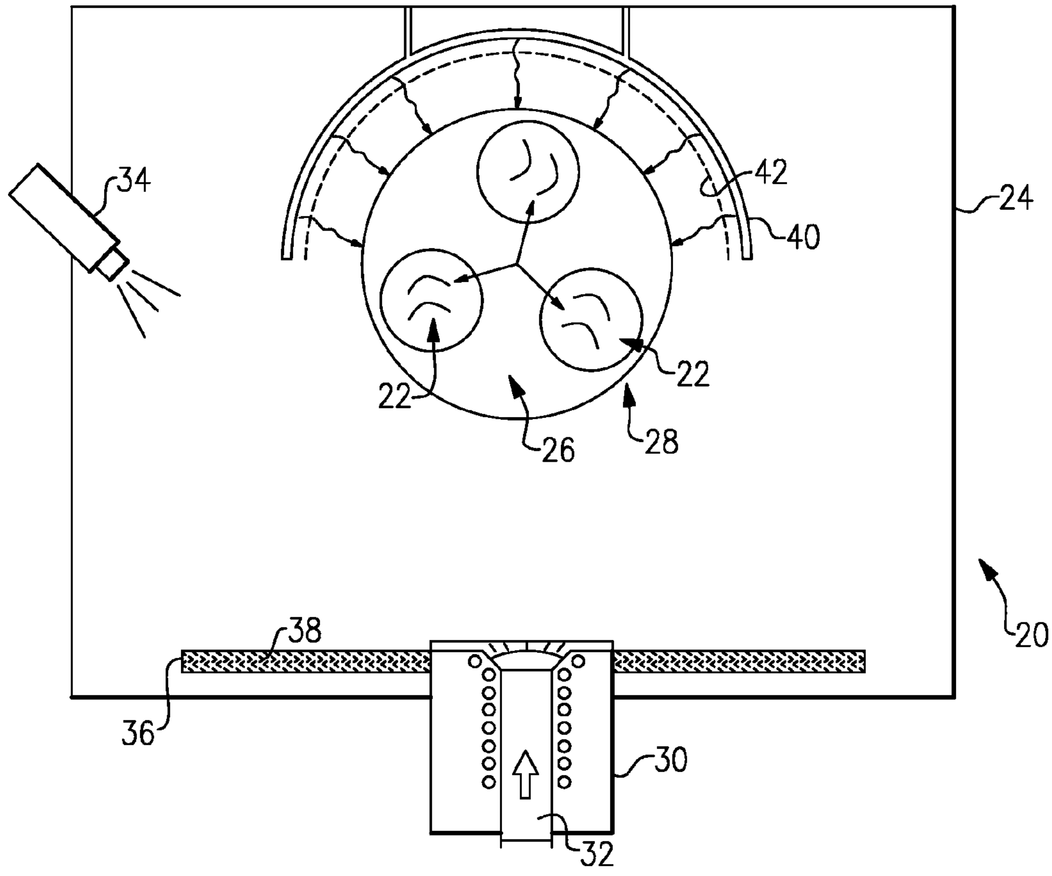
FIG. 1 illustrates an example coating deposition apparatus.

FIG. 1 shows a schematic view of selected portions of an example coating deposition apparatus 20 (i.e., apparatus) for depositing a coating on a plurality of work pieces 22 via vapor deposition. As can be appreciated from the following description, the example apparatus 20 is designed for electron beam directed vapor deposition. However, the apparatus 20 may alternatively be designed for other types of vapor deposition processes, such as but not limited to electron beam physical vapor deposition or other line-of-sight deposition processes.

The work pieces 22 may be gas turbine engine components, such as airfoils (e.g., blades or vanes), or other components. As will be described in further detail below, the apparatus 20 may be used to deposit a coating material onto surfaces of the work pieces 22 that are not in a line-of-sight of the emitted source coating material or surfaces that are oriented at a steep angle with regard to the line-of-sight.

The type of coating may be any desired coating that is suitable for vapor deposition, such as a metallic coating or a ceramic coating. For instance, the coating is a metallic bond coat or a ceramic thermal barrier coating that includes gadolinia, zirconia, yttria or combinations thereof.

The coating deposition apparatus 20 generally includes a coating chamber 24 for containing the work pieces 22. The coating chamber 24 may be a vacuum chamber and may include various ports for evacuating the interior or for selectively introducing gases that are to be used in the coating process. One or more gas sources (not shown) may be used to provide a desired flow of oxygen or other gas into the coating chamber 24. A pump (not shown) may also be provided to circulate a coolant, such as water, through walls of the coating chamber 24 to control wall temperature.

The work pieces 22 are mounted on a fixture 26 within a coating zone 28. For instance, the coating zone 28 is the spatial volume where the work pieces 22 will be coated. A crucible 30 is located adjacent the coating zone 28, below the fixture 26 in the illustrated example, to present a source coating material for deposition onto the work pieces 22. In this example, the coating deposition apparatus 20 includes at least one electron beam source 34, such as an electron beam gun, mounted relative to the coating chamber 24. One or more electron beam sources 34 may be used to emit electron beams onto a heat source 36 that contains a media 38 to preheat the work pieces 22 to a desired temperature. The electron beam source 34 may also be used to emit electron beams onto the source coating material 32 to vaporize the coating material 32 to coat the work pieces 22.

The coating deposition apparatus 20 may also include a thermal hood 40 for controlling the temperature within the coating zone 28. A screen 42 is located between the crucible 30 and the thermal hood 40 for limiting deposition of the coating material onto the interior surface of the thermal hood 40.

Figure 2:
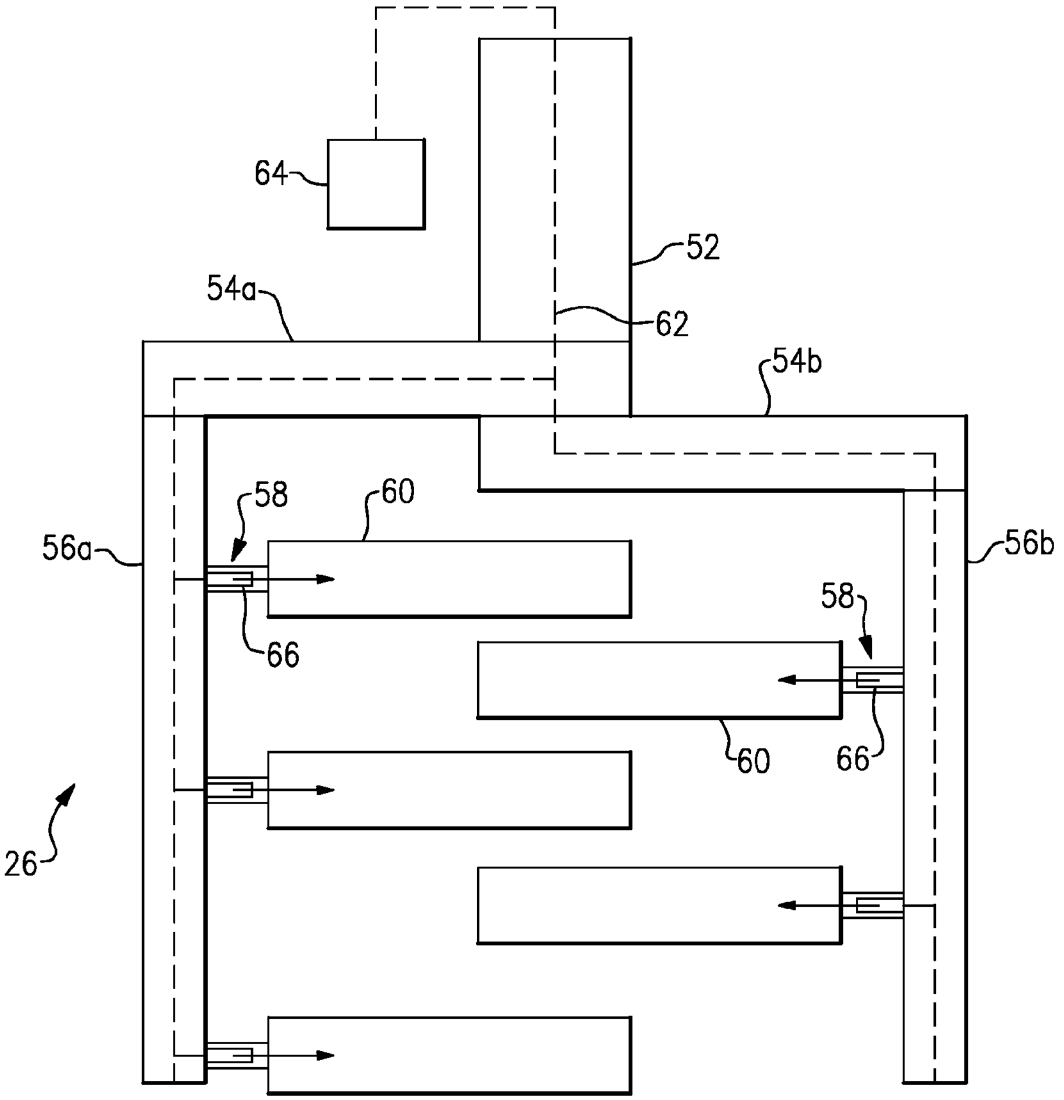
FIG. 2 illustrates an example fixture for a coating deposition apparatus.
Figure 3:
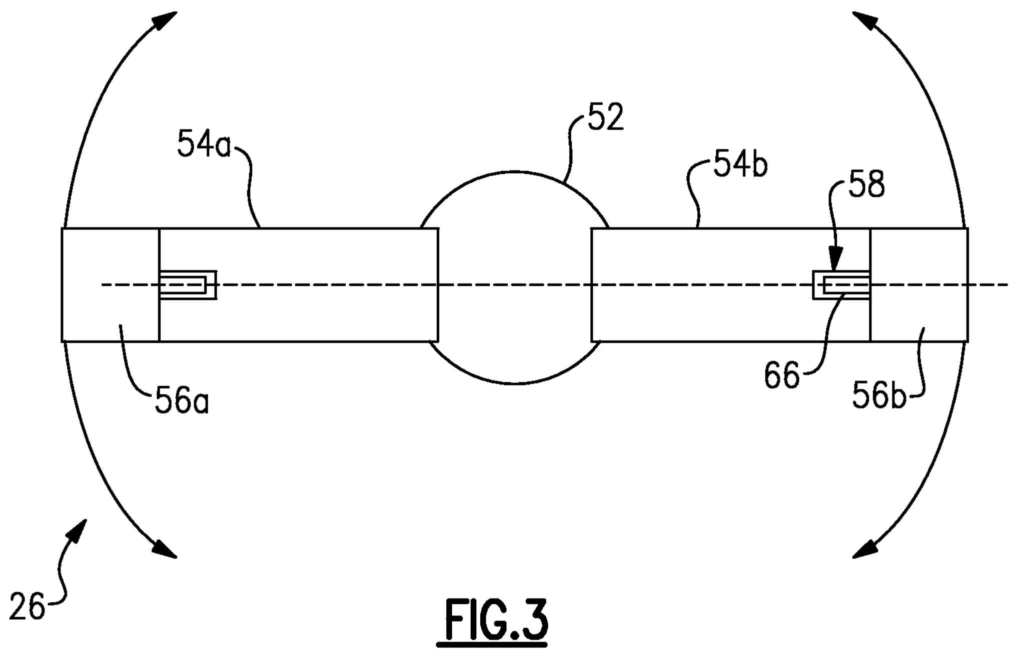
FIG. 3 illustrates an axial view of the fixture of FIG. 2.

FIGS. 2 and 3 illustrate an example of the fixture 26 used to suspend the work pieces 22 within the coating zone 28. In this example, the fixture 26 includes a sting shaft 52. The sting shaft 52 may be movable, for example, via an actuator (not shown) to transport the work pieces 22 in and out of the coating zone 28 and position the work pieces 22 within the coating zone 28. For instance, the sting shaft 52 is axially moveable and rotatable (FIG. 3) to move and position the work pieces 22 on the fixture 26 in unison.

A pair of opposed laterally extending arms 54*a* and 54*b* extend from the sting shaft 52. Each of the laterally extending arms 54*a* and 54*b* includes a respective support arm 56*a*, 56*b* extending therefrom. The support arms 56*a* and 56*b* generally extend along a direction that is parallel to the long axis of the sting shaft.

Each of the support arms 56*a* and 56*b* includes mounts 58 that are adapted to hold a work piece 22 in a work piece location 60. In this example, the mounts 58 are located on the interior of the structure formed by the fixture 26. That is, the mounts 58 are interior of the U-shape formed by the laterally extending arms 54*a* and 54*b* and support arms 56*a* and 56*b*.

The coating deposition apparatus 20 further includes a gas supply passage 62 that runs within the fixture 26. The gas supply passage 62 is connected with a gas source 64, which may be located outside of the coating chamber 24. The gas supply passage 62 runs through the sting shaft 52, laterally extending arms 54*a* and 54*b*, and the support arms 56*a* and 56*b*. A plurality of nozzles 66 are connected to the gas supply passage 62 and are respectively directed at the work piece locations 60. As an example, the nozzles 66 may be incorporated within the mounts 58 or otherwise located near the work piece locations 60. In the example configuration, the nozzles 66 on the support arm 56*a* are directed in an opposite direction from the nozzles 66 on the other support arm 56*b*, which further facilitates scattering the vaporized source material.

Figure 4:
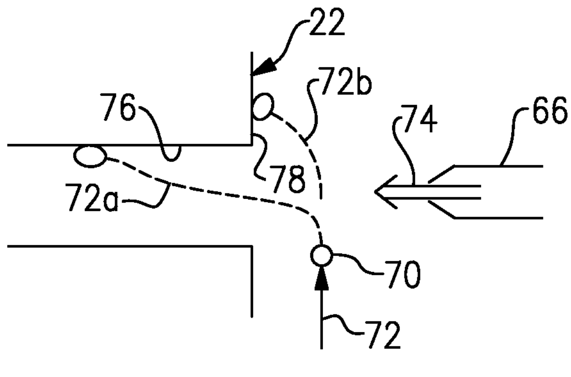
FIG. 4 illustrates an example method for use with a coating deposition apparatus.

Referring to FIG. 4, the nozzles 66 of the fixture 26 serve to emit a gas that scatters the vaporized source coating material such that the coating material can be deposited onto angled surfaces or non-line-of-sight surfaces of the work pieces 22. For instance, physical vapor deposition and other similar processes are generally considered to be line-of-sight deposition processes in that the vapor that is emitted from the crucible 30 deposits onto surfaces of the work pieces 22 that have a line-of-sight to the crucible 30. Surfaces that are oriented at a steep angle to the line-of-sight or that are out of the line-of-sight receive less coating material because the vaporized coating material 70 generally follows a line-of-sight path 72 from the crucible 30 toward the coating zone 28.

The nozzles 66 serve to emit a gas stream 74 that is directed at the respective work piece 22 in the work piece location 60. The emitted gas stream 74 changes the path of travel 72 of the vaporized coating material 70 such that the vaporized coating material 70 is redirected along an alternate path, such as paths 72*a* or 72*b* and deposits onto surface 76 or surface 78 of the work piece 22. For instance, the surface 76 is a non-line-of-sight surface with regard to line-of-sight to the crucible 30. Surface 78 is an angled surface with regard to the line-of-sight to the crucible 30. The nozzles 66 and the emitted gas stream 74 thereby facilitate the deposition of the coating material onto difficult to coat surfaces and thereby extend the coating capability of a physical vapor deposition process or other similar line-of-sight process.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure. The scope of legal protection given to this disclosure can only be determined by studying the following claims.

What is claimed is:

1. A coating deposition apparatus comprising:

a common, movable fixture including a plurality of mounts adapted to mount work pieces at respective work piece locations;

a crucible adjacent the plurality of mounts for emitting a source coating material; and a plurality of gas nozzles respectively directed at the work piece locations wherein the plurality of mounts are on a fixture that includes a shaft with a pair of opposed laterally extending arms and support arms that respectively extend from the laterally extending arms in a direction parallel to the shaft; and the mounts are located on the support arms;

a gas supply passage that runs within the laterally extending arms and the support arms and is connected to the plurality of gas nozzles.

2. The coating deposition apparatus as recited in claim 1, further comprising a gas source connected with the plurality of gas nozzles.

3. The coating deposition apparatus as recited in claim 1, wherein at least one of the plurality of gas nozzles is directed in an opposite direction from at least one other of the plurality of gas nozzles.

4. The coating deposition apparatus as recited in claim 1, further comprising at least one electron beam source.

5. The coating deposition apparatus as recited in claim 1, wherein the common, moveable fixture includes the plurality of gas nozzles, and the plurality of gas nozzles are spaced apart from the respective work piece locations.

6. The coating deposition apparatus as recited in claim 1, wherein the common, moveable fixture includes the plurality of gas nozzles and, when the work pieces are mounted, each of the plurality of gas nozzles is directed toward an angled non-line-of-sight surface of one of the work pieces with respect to a line-of-sight between the respective work pieces and the crucible.

7. The coating deposition apparatus as recited in claim 1, wherein the common, moveable fixture includes the plurality of gas nozzles, and the plurality of gas nozzles are distinct pieces from the respective plurality of mounts.

8. The coating deposition apparatus as recited in claim 1, wherein each of the plurality of mounts is configured to suspend one of the work pieces in the respective work piece location.

9. The coating deposition apparatus as recited in claim 1, wherein at least one of the plurality of gas nozzles is directed in an opposite direction from, and towards, at least one other of the plurality of gas nozzles.

10. A coating deposition apparatus comprising:

a common, moveable fixture including a plurality of mounts adapted to mount work pieces at respective work piece locations;

a gas supply passage that runs within the fixture;

a crucible adjacent the plurality of mounts for presenting a source coating material; and a plurality of gas nozzles connected with the gas supply passage and respectively directed at the work piece locations wherein the plurality of mounts are on a fixture that includes a shaft with a pair of opposed laterally extending arms and support arms that respectively extend from the laterally extending arms in a direction parallel to the shaft; and the mounts are located on the support arms;

a gas supply passage that runs within the laterally extending arms and the support arms and is connected to the plurality of gas nozzles.

11. The coating deposition apparatus as recited in claim 10, wherein the fixture includes a shaft with a pair of opposed laterally extending arms and support arms that extend from the respective laterally extending arms in a direction that is parallel to the shaft.

12. The coating deposition apparatus as recited in claim 11, wherein the gas supply passage runs within the laterally extending arms and the support arms.

13. The coating deposition apparatus as recited in claim 12, wherein the plurality of gas nozzles are located on the support arms.

14. The coating deposition apparatus as recited in claim 10, wherein the fixture is movable relative to the crucible such that the mounts move in unison.

* * * * *

UNITED STATES PATENT AND TRADEMARK OFFICE

CERTIFICATE OF CORRECTION

PATENT NO. : 8,506,715 B2
APPLICATION NO. : 12/977298
DATED : August 13, 2013
INVENTOR(S) : Neal It is certified that error appears in the above-identified patent and that said Letters Patent is hereby corrected as shown below:

IN THE CLAIMS:

Claim 1, Column 4, Line 2: "piece locations" should read as --piece locations;--

Claim 10, Column 4, Lines 52-53:

"passage and respectively directed at the work piece locations"

should be read as

--passage and respectively directed at the work piece locations;--

Signed and Sealed this
Fifth Day of November, 2013

Teresa Stanek Rea
*Deputy Director of the United States Patent and Trademark Office*